(12) United States Patent
Grant (10) Patent No.: US 6,762,645 B1
(45) Date of Patent: Jul. 13, 2004

(54) LOW POWER AUDIO DEVICE (75) Inventor: Duncan Andrew Grant, Bristol (GB)

(73) Assignee: The University of Bristol, Bristol (GB)

( * ) Notice: Subject to any disclaimer, the term of this patent is extended or adjusted under 35 U.S.C. 154(b) by 0 days.

(21) Appl. No.: 09/202,596

(22) PCT Filed: Jun. 18, 1997

(86) PCT No.: PCT/GB97/01644
§ 371 (c)(1),
(2), (4) Date: Dec. 17, 1998

(87) PCT Pub. No.: WO97/50172
PCT Pub. Date: Dec. 31, 1997

(30) Foreign Application Priority Data

Jun. 21, 1996 (GB) ............................................. 9613049

(51) Int. Cl.$^7$ ............................. H03F 1/00; H03F 3/317
(52) U.S. Cl. ..................... 330/251; 330/207 A; 330/10; 455/572; 323/282
(58) Field of Search ................................. 381/120, 321, 381/123, 96, 108; 330/10, 251, 207 A; 455/572, 573, 574, 343.1, 343.2, 343.5, 127.1, 127.2, 127.3, 127.4, 127.5

(56) References Cited

U.S. PATENT DOCUMENTS

| | | | |
|---|---|---|---|
| 4,531,096 A | * | 7/1985 | Yokoyama ................... 330/10 |
| 4,672,327 A | | 6/1987 | Wittlinger ................... 330/269 |
| 5,262,733 A | * | 11/1993 | Nakajima et al. ............. 330/10 |
| 5,506,532 A | * | 4/1996 | Milazzo ...................... 327/175 |
| 5,815,581 A | * | 9/1998 | Andersson .................. 381/321 |
| 6,016,075 A | * | 1/2000 | Hamo .......................... 330/10 |
| 6,173,063 B1 | * | 1/2001 | Melanson ................... 381/318 |
| 6,424,208 B1 | * | 7/2002 | Pinai .......................... 327/554 |

FOREIGN PATENT DOCUMENTS

| | | |
|---|---|---|
| EP | 0534804 | 3/1993 |
| WO | 9411799 | 5/1994 |

OTHER PUBLICATIONS

"Switching Audio Amplifier Uses Power MOSFETS," *Electronics World and Wireless World*, vol. 97, No. 1676, Jul. 1, 1992, p. 596.
Switching Audio Amplifier Uses Power Mosfets, Electronics World & Wireless World, Reed Business Publishing, Sutton, Surrey, GB, vol. 97, No. 1676; Jul. 1, 1992.
European Search Report, dated Aug. 6, 2001.

* cited by examiner

*Primary Examiner*—Xu Mei
(74) *Attorney, Agent, or Firm*—Baker Botts L.L.P.

(57) ABSTRACT

An electrical device has an audio output, and the electrical device includes a radio receiver circuit, a class D amplifier, and an audio output element. The radio receiver circuit operates at a lower supply voltage than the amplifier. Moreover, the voltage supply for the radio receiver circuit is generated by a converter operating in a switched manner.

27 Claims, 8 Drawing Sheets

LOW POWER AUDIO DEVICE

The present invention relates to a low power audio device, such as a low power radio. Such a low power device can dramatically reduce battery consumption, can reduce the role of a battery to that of a secondary storage device, or make the batteries redundant in favour of a solar or mechanical energy source.

Radio remains a powerful communications medium in many parts of the world. Conventional radios are relatively power hungry devices. This is not a problem in affluent societies, but in more remote societies the cost of batteries may make them prohibitively expensive to the local population, thereby causing radios to be under-utilised. Thus, the potential to broadcast messages concerning public health and safety is diminished since many of the intended audience may not be listening.

According to the present invention, there is provided an electrical device having an audio output, the device comprising a signal processing circuit, a class D amplifier, and an audio output element, the amplifier and the signal processing circuit operating at respective supply voltages.

It is thus possible to tailor the supply voltages of the individual parts of the electrical device so that they operate on the minimum supply voltage consistent with their function.

Preferably, the class D amplifier is arranged to produce the supply for the signal processing circuit.

The class D amplifier may be configured to have a single ended output stage. Such an arrangement allows the voltage swing across the output element to be substantially equal to the supply voltage of the class D amplifier.

Preferably, the class D amplifier is configured to have a "H" bridge output stage. This gives an enhanced peak-to-peak voltage swing across the audio output element. The peak-to-peak voltage is substantially equal to twice the supply voltage of the class D amplifier.

Preferably, the audio output is a loudspeaker. The loudspeaker may be a moving coil loudspeaker. However, for improved efficiency, especially at higher volumes, a piezoelectric transducer may be used.

Preferably, the class D amplifier is placed in a shielded enclosure with the leads into and out of the enclosure being filtered to reduce electromagnetic interference.

Advantageously, a clock generator and comparator for producing a pulse width modulated drive to the class D amplifier is also contained within the enclosure. Advantageously, the switching clock frequency is in the range of 25 kHz to 120 kHz.

Preferably, the switching frequency is 90 kHz when the output element is a piezoelectric transducer. Such a frequency represents a compromise between reducing ripple current to the transducer (ripple current reducing with higher switching frequency) and keeping switching losses low (switching losses increasing with increasing frequency). A lower switching frequency can be used to drive a moving coil loudspeaker.

Preferably, the clock generator for use in the pulse-width modulation scheme is used to drive a flip-flop configured to produce a square wave output at half the clock frequency. The average voltage of the square wave is half the flip-flop supply voltage. Thus, the output signal of the flip-flop can be low pass filtered to derive a direct current supply of substantially 1.5 volts when the flip-flop is driven from a 3 volt supply. This reduced supply voltage can be used to power the signal processing circuit. Alternatively, a comparator may be used to compare the voltage supplied to the processing circuit with a reference voltage. This circuit can be arranged to cause a charge on a storage capacitor to be topped up via a semiconductor element used in a switching mode when the voltage falls below a preset threshold.

Preferably, the signal processing circuit is a radio receiver.

Advantageously, the receiver will be a superheterodyne design.

Preferably, at least the resonant circuits in the intermediate frequency amplifier-section of the superheterodyne receive will be formed from inductor capacitor combinations. The use of LC resonant circuits was commonplace in the early days of radio, but recently has given way to the use of resistive loads especially in the case of integrated circuits, with ceramic filters being used between stages to give the arrangement the required selectivity. Resistive loads are relatively inefficient and broadband. Ceramic filters give a narrow-band response but are attenuating devices. The use of an LC resonant circuit provides a tuned load with a high impedance at resonance and consequently allows the required amount of gain to be achieved with fewer amplification stages, and with stages operating on a lower quiescent current than is normally chosen. Thus, the power supply requirements of the radio receiver can be reduced thereby enabling further gains in battery life to be achieved.

Preferably, the signal processing circuit is implemented, at least in part, within an integrated circuit and the transistor circuits within the circuit are optimised to achieve high gain-bandwidth products at low quiescent current. The integrated circuit may incorporate connection to external tuned loads, thereby allowing both the advantages of IC fabrication and efficient loads to be enjoyed.

Advantageously, the radio will provide at least one of AM reception in the 500 kHz to 1600 kHz range, FM reception in the 88 MHz to 108 MHz range and shortwave reception on any one or more of the shortwave bands. The FM receiver circuit may utilise a conventional 10.7 MHz intermediate frequency and quadrature detector for signal discrimination. The AM receiver section may use the conventional 465 kHz intermediate frequency.

The present invention will further be described, by way of example, with reference to the accompanying drawings, in which.

Known portable radio receivers for broadcast reception typically operate from four 1.5 volt dry cells (giving a total voltage of 6 volts) and draw a current in the order of 20 to 35 mA depending on the design of the circuit and setting of the volume controls. This corresponds to a power demand from the batteries of between 120 and 210 mW. Assuming an average power consumption of 150 mW, four good quality C-type alkaline cells will power the radio for approximately 200 hours (i.e. 10 hours per day for 20 days) before they are exhausted.

The radio described herein requires only 3 to 5 mW of power, depending on the volume setting. Assuming an average power consumption of 4 mW, battery consumption would be approximately 1/37th of that of an ordinary radio. Consequently, four C-type batteries would power the radio for approximately 7400 hours (i.e. 10 hours per day for 2 years). Such a low power requirement enables the option of providing mains power as an alternative supply for the radio to be disregarded. Thus, reducing the component count and cost of the radio.

Furthermore, the power may be provided by a solar cell array or by a wind-up generator.

The circuits of the radio receiver can be divided into two major functions. These are:

Radio signal reception, whereby a circuit captures the radio signal, demodulates it and produces a weak audio signal. This is commonly referred to as the receiver circuit.

Audio amplification, whereby the weak audio signal is amplified until it has sufficient power to drive a loudspeaker.

In order to provide greatly extended battery life, the power consumption in both of the circuits needs to be reduced.

Figure 1:
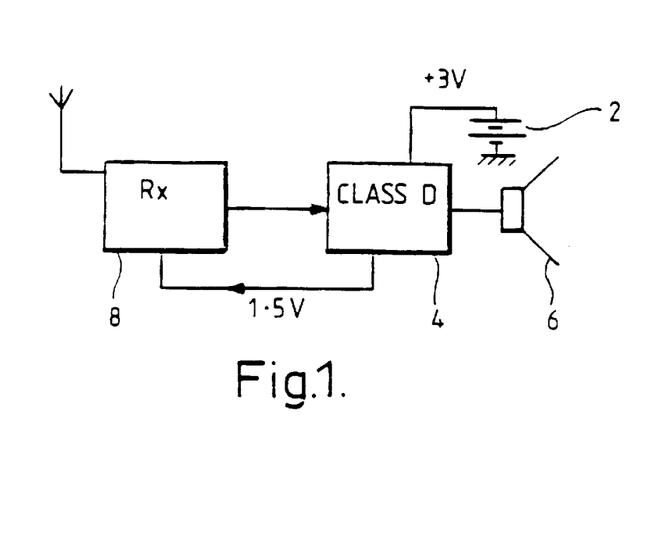
FIG. 1 schematically illustrates a radio constituting an embodiment of the present invention.

FIG. 1 shows a schematic illustration of a portable radio receiver constituting an embodiment of the invention. A 3-volt battery pack 2 provides power to a class D amplifier 4. The amplifier 4 drives a loudspeaker 6. The amplifier 4 also produces a 1.5 volt supply for the receiver 8. Hitherto, the amplifiers and receivers of portable radios have been operated at the same supply voltage. However, the voltage swings occurring within the transistors of a radio receiver are typically very small and consequently operating the receiver at the same supply voltage as the audio output amplifier is very wasteful of battery energy. The applicant has realised that significant power savings can be achieved by reducing the supply voltage to the receiver, thereby reducing unnecessary dissipation within the receiver.

Figure 2:
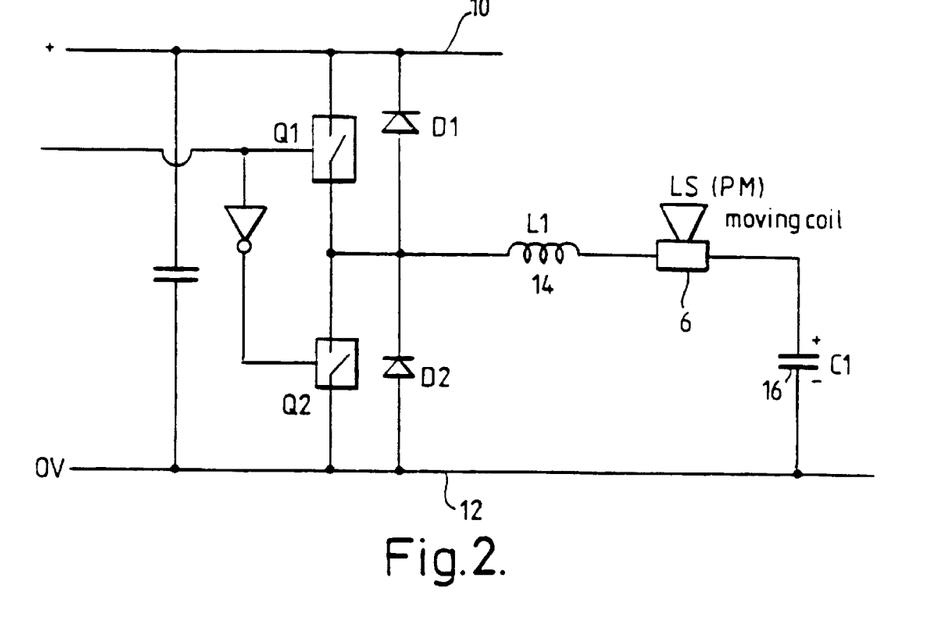
FIG. 2 schematically illustrates a class D output stage.

The class D amplifier schematically illustrated in FIG. 2 is efficient because the semiconductor devices Q1 and Q2 are switched between fully on and fully off, thereby reducing dissipation within the semiconductors. Furthermore, the amplifier is suitable for driving a capacitive load efficiently. Piezoelectric loudspeakers present a substantially capacitive load. These loudspeakers are available with diameters of at least 4" and have a lower cut-off frequency of 300 Hz. Whilst the base content of sound from this type of loudspeaker is not strong, the overall sound quality is quite acceptable. Additionally, a short cone can be used to load the speaker so as to emphasise the base tones. The impedance of a piezoelectric loudspeaker is approximately 1 microfarad and the device is efficient in converting electrical energy into sound energy. However, to achieve the required displacement of the transducer element, large amounts of charge (and therefore energy) must flow in and out of the loudspeaker each cycle of the audio signal. In order to realize high overall efficiency, the amplifier used to drive the loudspeaker must be capable of recovering the energy stored in the capacitive load that the speaker presents. A class D amplifier is able to recover this energy.

It should be noted that the amplifier can also drive a permanent magnet loudspeaker having a moving coil. These loudspeakers are typically only one to two percent efficient. This is partly due to the difficulty of coupling the loudspeaker cone to the air without use of an unacceptably large horn. However, it is also due to the fact that moving coil loudspeakers appear as a resistance of approximately 8 ohms over most of their frequency range. At certain frequencies, the impedance may include a reactive element, but most of the losses are associated with the current flowing through the resistance of the coil. These losses are proportional to the square of the current in the coil. Thus, as more current movement is required, losses increase sharply.

However, a permanent magnet loudspeaker can be used in radios constituting an embodiment of the present invention with little increase in power requirement when the radio is to be operated at low volume. However, at greater levels of loudness, the power demand rises steeply although a loud sound can still be achieved with a permanent magnet speaker with only ten percent of the power consumption that would be required by a conventional radio.

As shown in FIG. 2, the switching elements Q1 and Q2, which can be implemented by field-effect transistors, are arranged in series and driven in anti-phase. Thus, the loudspeaker 6 is either connected to the supply rail 10 or to the 0 volt rail 12. An inductor 14 is provided in series with the loudspeaker 6 in order to smooth out switching transients which occur due to the essentially digital nature of the amplifier. A capacitor 16 is provided to block DC current flow. Diodes D1 and D2 are connected in parallel with the semiconductor switches Q1 and Q2 and act as flyback diodes, thereby shielding the semiconductor switches from inductive current flow during device switching.

Figure 3:
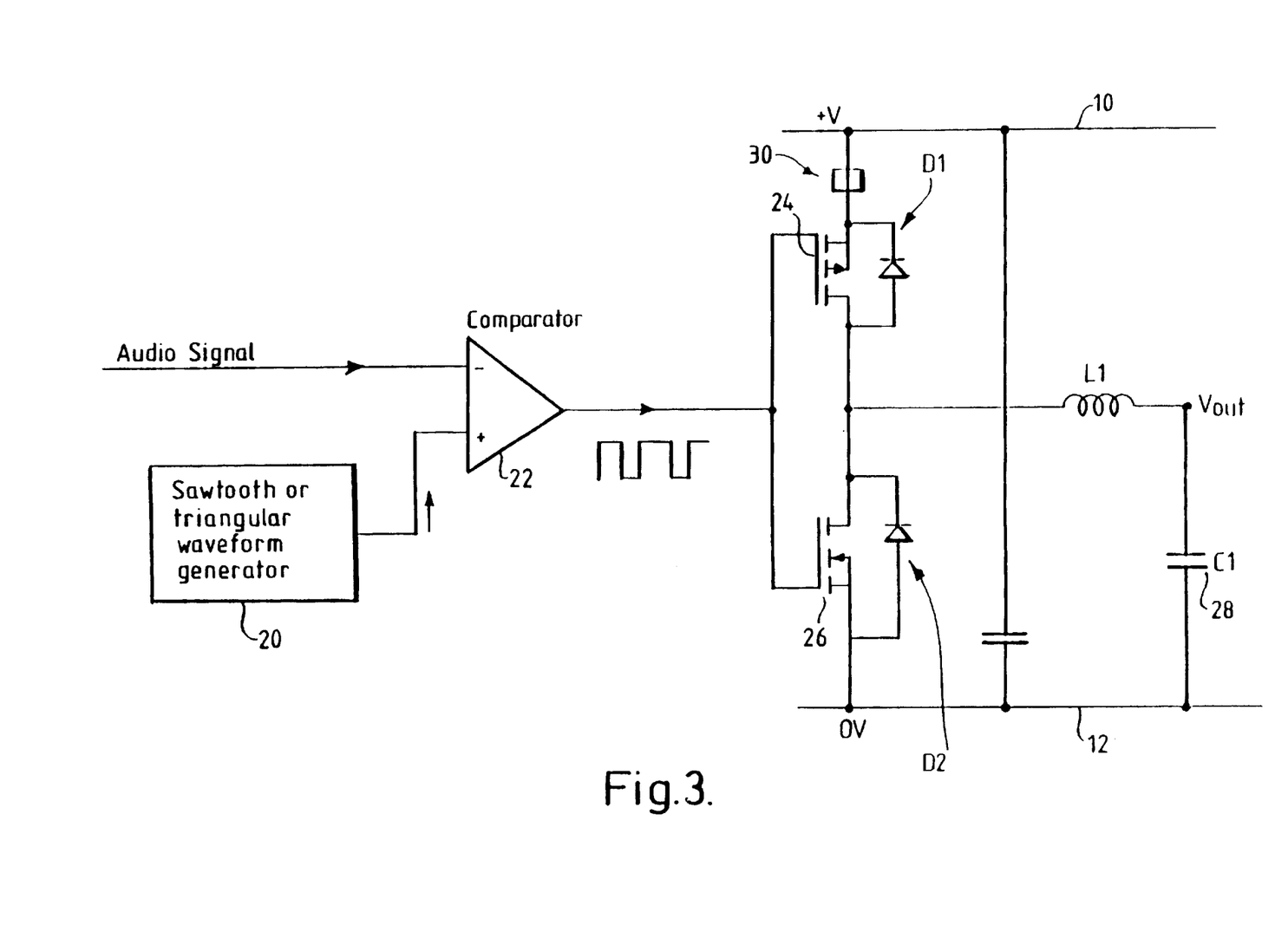
FIG. 3 schematically illustrates a realisation of the class D amplifier shown in FIG. 2.

The class D amplifier is driven by a pulse-width modulated signal obtained by comparing an audio signal with a reference waveform which is a sawtooth or triangular wave. FIG. 3 schematically illustrates an embodiment of the amplifier. A waveform generator 20 (generating a sawtooth or triangular wave) is connected to the non-inverting input of a comparator 22. An audio signal is supplied to the inverting input of the comparator. The output of the comparator is therefore a pulse-width modulated signal representing the magnitude of the audio signal. First and second field-effect transistors 24 and 26 are connected in series between the power supply rail 10 and the ground rail 12. The first field-effect transistor 24 is an N channel device, whereas the second field-effect transistor 26 is a P channel device. The gates of the field-effect transistors 24 and 26 are connected to the output of the comparator 22. An output is picked off from the junction between the field-effect transistors and is supplied via an inductor L1 to a piezoelectric speaker 28 represented as a capacitor C1. A ferrite bead 30 is included in the connection between the first field-effect transistor 24 and the power supply rail 10 in order to limit current shoot-through. Similarly, diodes D1 and D2 are provided to inhibit current shoot-through. The diodes D1 and D2 may be externally provided Schottky diodes for efficiency, or they may be the body drain diodes internal to the MOSFET transistors.

The switching frequency (i.e. sawtooth or triangular wave frequency) of the class D amplifier should be at least twice that of the highest frequency component in the audio signal. 25 kHz is usual sufficient. However, lower inductor ripple current can be achieved for a given value of inductance by operating in a higher switching frequency. As noted before, the use of a higher switching frequency incurs more switching loss and power loss in charging and discharging the gates of the MOSFET in the output stage. However, experiments have indicated that switching frequency of about 90 kHz is satisfactory for driving a piezoelectric loudspeaker.

An important feature of the class D amplifier is that power can flow in both directions. When driving a purely reactive load, there will be power flow in both directions during the complete audio cycle. The current in the DC supply with therefore vary between positive and negative during each cycle. If there were no losses anywhere in the circuit, the average value of this DC current over one audio cycle would be zero. When driving the piezoelectric loudspeaker, there will be losses in the loudspeaker and there will be losses in the transistors, the diodes and in the resistance of other components, but the overall efficiency of this combination of loudspeaker and amplifier is high compared with that of a conventional class AB amplifier and permanent magnet loudspeaker arrangement.

Since the output voltage is developed across C1 in FIG. 3 (C1 representing a piezoelectric loudspeaker) or across C1 in FIG. 2 (where the loudspeaker 6 is a moving coil-type), the value of the series inductance must be chosen carefully). If it is too low, the ripple current at the switching frequency will be high and the associated losses in the MOSFETs of the amplifier will be significant. If the inductance is too high, it will present significant impedance to high frequency audio currents.

Figure 4:
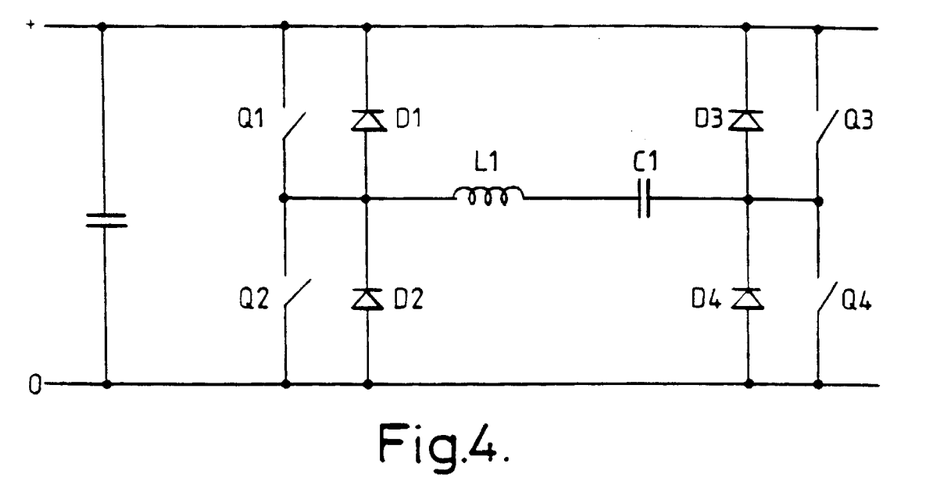
FIG. 4 schematically illustrates a "H" bridge amplifier arrangement.

In the pulse-width modulation waveform generator circuit, and in the amplifier output stages, there is a certain amount of current drawn from the supply which is independent of the power being delivered to the loudspeaker. This current is affectively the quiescent current of the amplifier. The quiescent power drain of the amplifier is therefore the quiescent current multiplied by the supply voltage. It is desirable to keep the supply voltage as low as possible in order to minimise power loss. However, the loudspeakers (whether moving coil or piezoelectric) require a certain voltage swing from the amplifier in order to obtain their dynamic performance. It has been found that using a 6 volt supply to the amplifier is beneficial in obtaining a good dynamic response. However, this can lead to unacceptably large quiescent losses. A solution to this problem is to couple two output stages together in a "H" bridge configuration. Such an arrangement is shown in FIG. 4. Comparing this with FIG. 3, it is seen that one plate of C1 was grounded in FIG. 3 and the other plate could be switched between 0 and the supply (+3 volts) rail. In FIG. 4, either plate of the capacitor can be connected to the ground, and either plate can be connected to the supply rail. Thus, the effective peak-to-peak voltage that can be applied to the capacitor C1 (which could represent the piezoelectric loudspeaker) is doubled. Thus, Q1 and Q4 are controlled to open and close together, and Q2 and Q3 are controlled to open and close together. Otherwise the operation of the amplifier is similar to that described in respect of FIG. 3.

Figure 5:
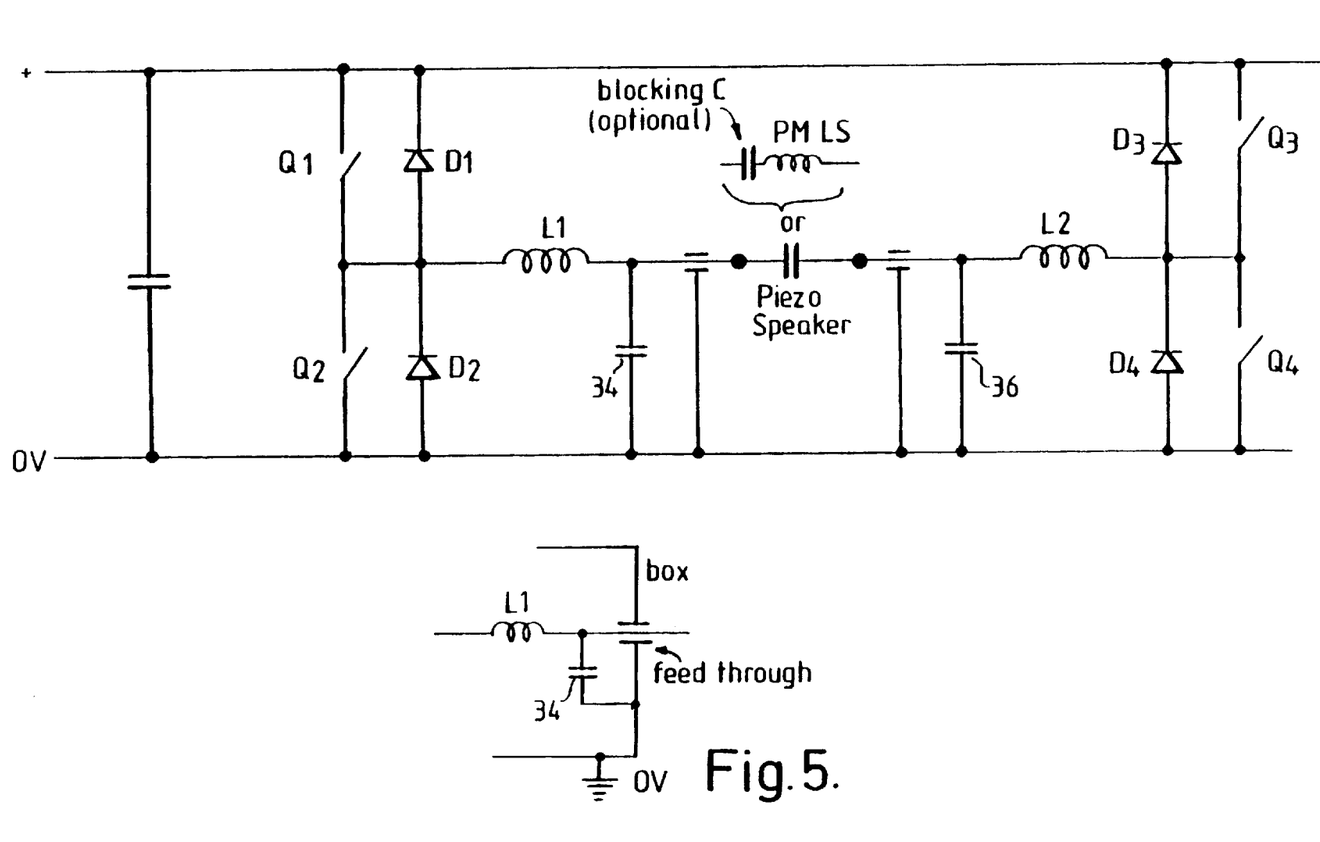
FIG. 5 shows an arrangement of FIG. 4 together with interference reducing means.

As noted hereinbefore, the class D amplifier employs high speed switching to generate a pulse-width modulated output waveform. The sharp waveform edges associated with the switching could generate electromagnetic radiation which could interfere with the performance of the radio receiver circuit. In order to overcome these problems, it is advantageous to enclose the amplifier in a shielded enclosure with feed through capacitors for the power and audio connections. It is also desirable that the switching components in the output waveform should also be filtered out inside the screened box. This can be achieved, as shown in FIG. 5, by splitting the inductor into two, one for each arm of the circuit, and adding a small capacitor 34 and 36 to each of the output terminals. The amplifier can then be used to drive either a piezoelectric or permanent magnet loudspeaker without interfering with the operation of the radio receiver circuits.

It will be noted that in the arrangement shown in FIG. 5, there is no series capacitor to block the DC component. If the amplifier were ideal, the DC component value of each half of the "H" bridge would be exactly equal and there would be no DC component between the two output terminals. However, due to drift in the pulse-width modulator generator and other circuit imperfections, there could effectively be a DC level introduced in the pulse-width modulated output waveform. This is not a serious problem for piezoelectric loudspeakers since they are effectively capacitive loads, but could lead to DC currents and serious power loss when used to drive permanent magnet moving coil loudspeakers if, for the sake of economy, this DC blocking capacitor was omitted. It may, indeed, be beneficial to exclude the blocking capacitor since there is no polarising voltage available to make possible the use of a conventional electrolytic capacitor. To ensure that each bridge operates at a fifty percent duty cycle where there is no audio input signal, and therefore that the average DC voltage is zero, the average output voltage of one leg of the bridge can be fed back to the modulator circuit to adjust the bias level in the amplifier. This will be described more fully with reference to FIG. 7. A more sophisticated bias scheme is to use a differential amplifier to sense the average voltage difference across the output terminals of the amplifier and feed this signal back to the pulse-width modulator waveform generator.

Figure 6:
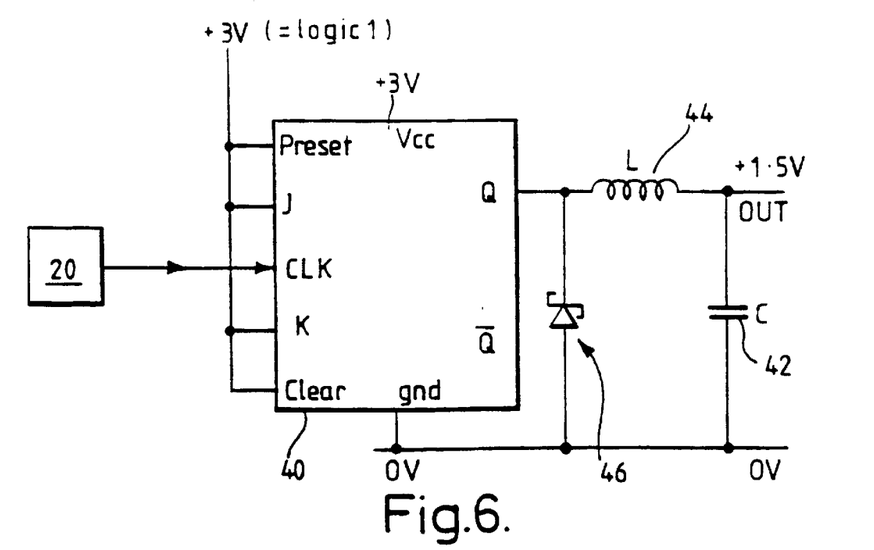
FIG. 6 illustrates a device for deriving a 1.5 volt supply from a 3 volt input.

As has been stated hereinbefore, it is important for efficiency that each part of the circuit is operated at the lowest realistic possible voltage. It will be shown later than a 1.5 volt supply is quite sufficient for the radio receiver circuit. Whilst this supply might be obtained from a separate battery, or from a tap on the battery chain, the different batteries would run out at different times causing confusion to the user. It is therefore better to generate an auxiliary 1.5 volt supply within the radio. This can be done by using the clock signal from the pulse-width modulator generator of the audio amplifier to clock a flip-flop, as shown in FIG. 6. A JK flip-flop 40 is wired such that with each clock signal its Q and Q' outputs alternately change between logical 1 and logical 0. A similar arrangement can be implemented in other flip-flop architectures. Thus, the Q output of the flip-flop 40 will be a square wave at half the pulse-width modulator clock frequency. The Q output is fed to a storage capacitor 42 via an inductor 44. The inductor capacitor combination averages the output of the flip-flop to obtain a 1.5 volt supply. A Zenner diode 46 provides protection for the flip-flop against inductively induced currents during the switching of the Q output.

Figure 7:
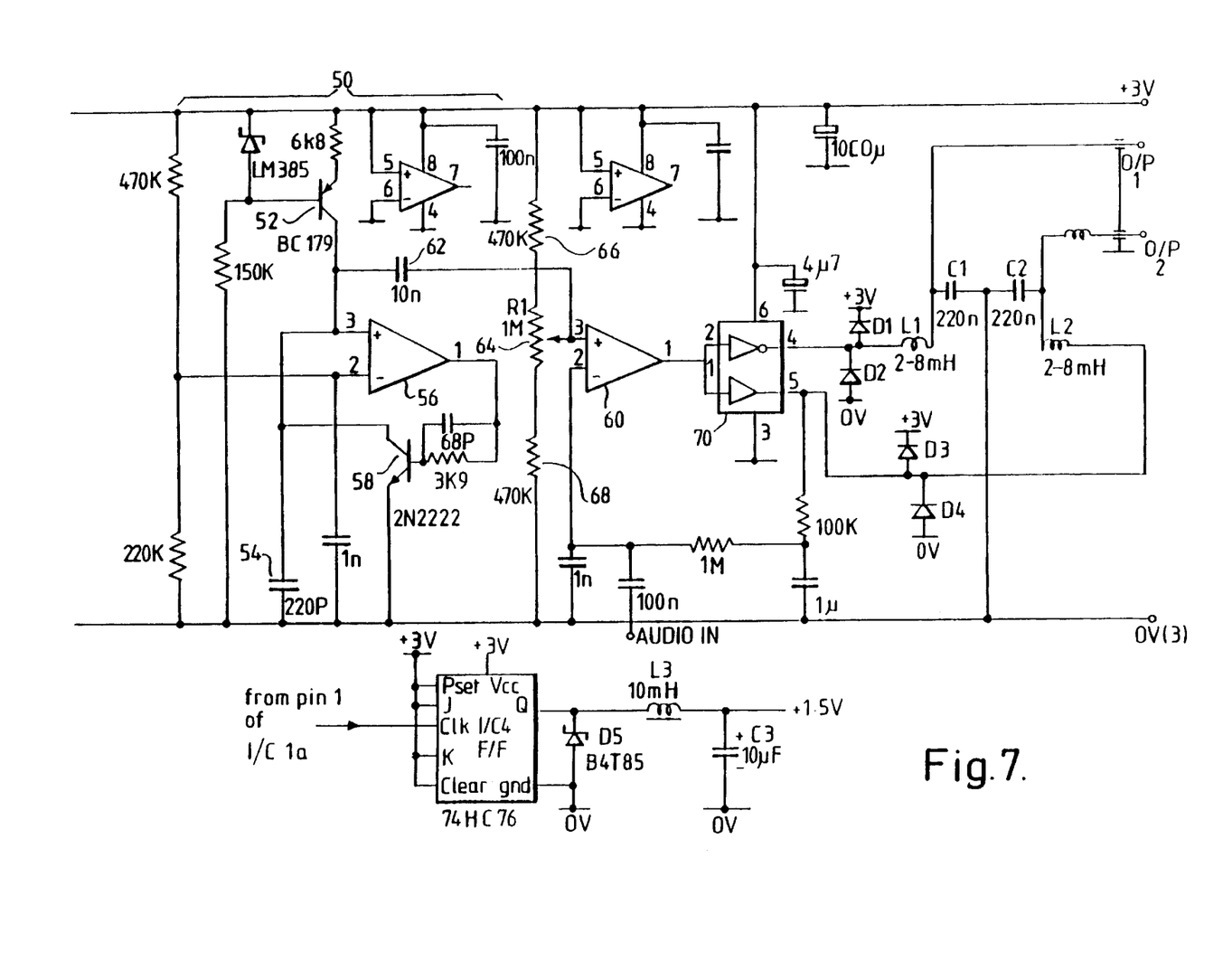
FIG. 7 is a circuit diagram of a first embodiment of a class D amplifier including a sawtooth generator and a comparator.

A complete audio amplifier is illustrated in FIG. 7. A sawtooth generator 50 comprises a constant current source (based around transistor 52) which charges a capacitor 54. Thus, the voltage across the capacitor 54 rises linearly. A comparator 56 monitors the voltage across the capacitor 54 and, when the voltage exceed a predetermined level, operates transistor 58 to discharge the capacitor 54. Thus, a repetitive sawtooth waveform is generated. This sawtooth is applied to the non-inverting input of a comparator 60 via a capacitor 62. The non-inverting input is also connected to a DC voltage source formed by potentiometer 64 and resistors 66 and 68. The remainder of the circuit is effectively as described with reference to FIG. 3, with the MOSFET transistors being implemented within a MOSFET driver package 70. Alternatively, a logic inverter integrated circuit can be used in place of the MOSFET driver. The output of one of the MOSFET drivers (pin 5 as shown in FIG. 7) is fed back to the pulse-width modulator generator to ensure that the pulse-width modulation waveform has a quiescent duty cycle of fifty percent (as set by the potentiometer 64). The outputs of the MOSFETs within the MOSFET driver 70 are supplied to the output terminals of the amplifier OP1 and OP2 via inductors L1 and L2 and capacitors C1 and C2. Diodes D1 to D4 may be provided as discrete components or, since the output transistors in some logic packages include integral anti-parallel diodes, these diodes may be used to perform the functions of D1 to D4.

Figure 8:
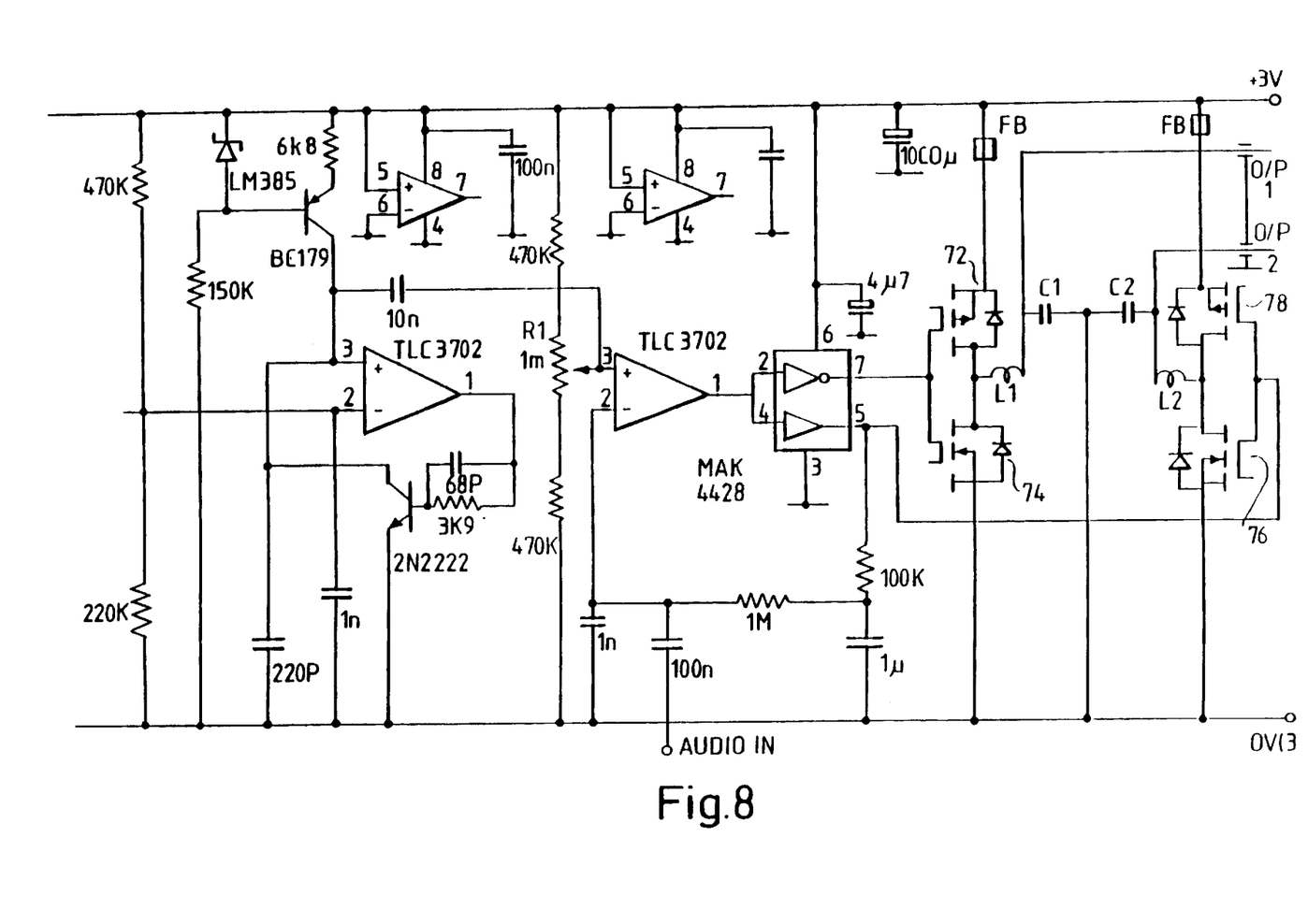
FIG. 8 illustrates a class D amplifier like that of FIG. 7, but having an "H" bridge output.

If the amplifiers are required to drive a permanent magnet loudspeaker at high power levels, the losses in the resistance of the MOSFET driver output transistors may be too high for good efficiency and load distortion. It is then necessary to add discrete MOSFET output devices 72, 74, 76 and 78, as shown in FIG. 8. These discrete MOSFETs have a lower ON resistance (Rds(on)) and the power loss in these devices at high output powers will be acceptable. The power loss associated with driving the gate capacitances of these devices is outweighed by the power saving resulting from having a lower Rds(on) final stage.

As noted hereinbefore, it is common practice that the radio receiver circuits in a portable radio be supplied with the same voltage as that used in the audio amplifier circuit. However, the voltage swings associated with the waveforms encountered in the radio circuit are tiny compared with the voltage swings found in the audio amplifier output stage. Therefore, unlike the audio amplifier stage, the supply voltage required for the radio circuit is not dictated by the amplitude of the signals being processed. In the radio receiver stage, the supply voltage need only be sufficient to ensure that the transistors in the circuit provide an adequate level of gain. For bipolar transistors, this requires a supply voltage of at least one volt. A supply voltage of 1.5 volts provides an adequate margin above this minimum level.

The gain-bandwidth product of a transistor is a function of the bias current. The lowest practical bias current for each transistor stage should be used consistent with obtaining the required gain from that amplification stage. The transistors should be chosen for their ability to attain a high. gain bandwidth product at low bias currents.

Figure 10:
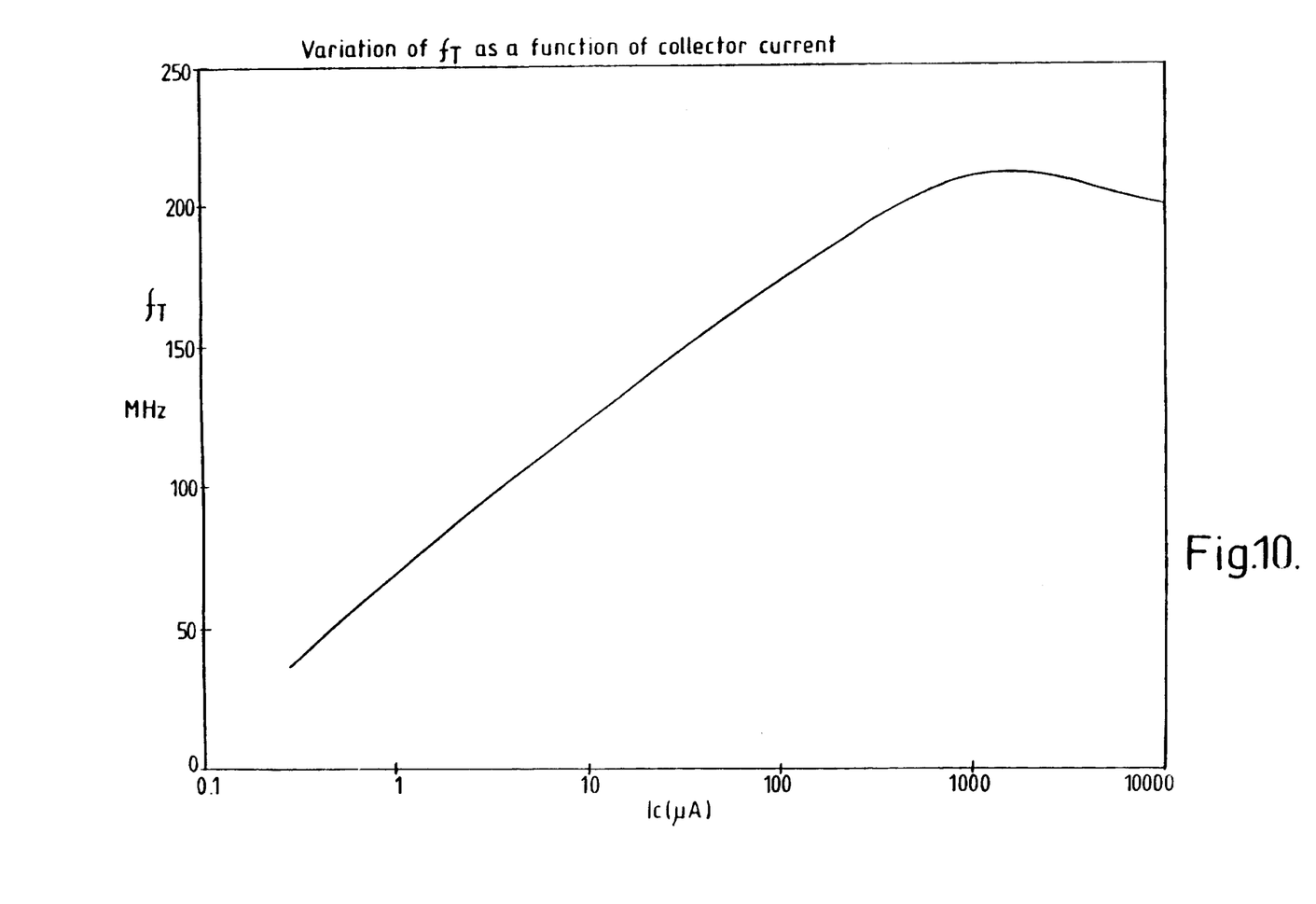
FIG. 10 is a graph illustrating $f_T$ versus Ic for a typical small signal bipolar transistor.

It is common in radio engineering for the bias currents to be selected so as to maximise the device current gain β and $f_T$. As shown in FIG. 10, $f_T$ increases with increasing bias current until it reaches a turning point which, for RF and small signal bipolar transistors, is typically around 1 to 3 mA. Reducing the bias current reduces $f_T$. However, the applicants have realised that reducing the bias current from the current giving maximum $f_T$ only gives rise to a relatively minor reduction in $f_T$. Thus, when emphasis is placed on saving power, the reduction in bias current is clearly beneficial as a significant reduction is bias current gives rise to only a modest reduction in $f_T$. A traditional radio receiver design might include an RF amplifier stage operating at 6V with 1 mA bias current, leading to a steady state dissipation of 6 mW. The same transistor might well be capable of operating acceptably with a supply voltage of 1.5V and 0.4 mA of bias current, thereby having a steady state power dissipation of 0.6 mW, i.e. only 10% of that of the conventional design.

It has become the common practice to use integrated circuit amplifiers in radio receivers. This applies particularly to the IF (intermediate frequency) stages, and often to RF (radio frequency) stages as well. Since it is not convenient to incorporate inductors in integrated circuits, the use of tuned loads in the amplifier stages has largely been abandoned in favour of less efficient resistor loads, the loss of gain being accommodated by more gain stages. However, power reductions can be achieved by returning to the use of tuned loads. A further advantage of tuned loads is that, unlike ceramic filters, they do not introduce attenuation within the pass-band. Furthermore, the required selectivity can also be achieved by appropriate tuning of the tuned loads. A significant advantage of a tuned collector load is that it has a low resistance to the bias current whilst retaining a high impendence with respect to the selected RF or IF signal, thereby enabling larger gains to be achieved. In use, the radio receiver can be implemented within an integrated circuit having external connections for interfacing with the various tuned loads. Integrated circuits have the advantage that the dimensionally small transistors can be produced. Since the gain-bandwidth product and $f_T$ (the frequency at which the current gain falls to unity) depend to some extent on the current density, a small transistor has the ability to attain a good gain bandwidth product and $f_T$ when operated at lowest bias currents. The ceramic filters may also be used if the improvement in discrimination is sufficient to outweigh the disadvantage of the signal attenuation which these filters introduce.

Since gain-bandwidth product and $f_T$ are usually obtained at the expense of high bias current, it is prudent, when lower power consumption is required, to reduce the frequency of the signal as soon as possible. This means converting to intermediate frequency as soon as possible and then, again, to audio frequency as soon as possible. Clearly, AM receivers, with lower RF and IF frequencies will have an advantage in terms of power consumption required to obtain a given level of signal gain.

Figure 9:
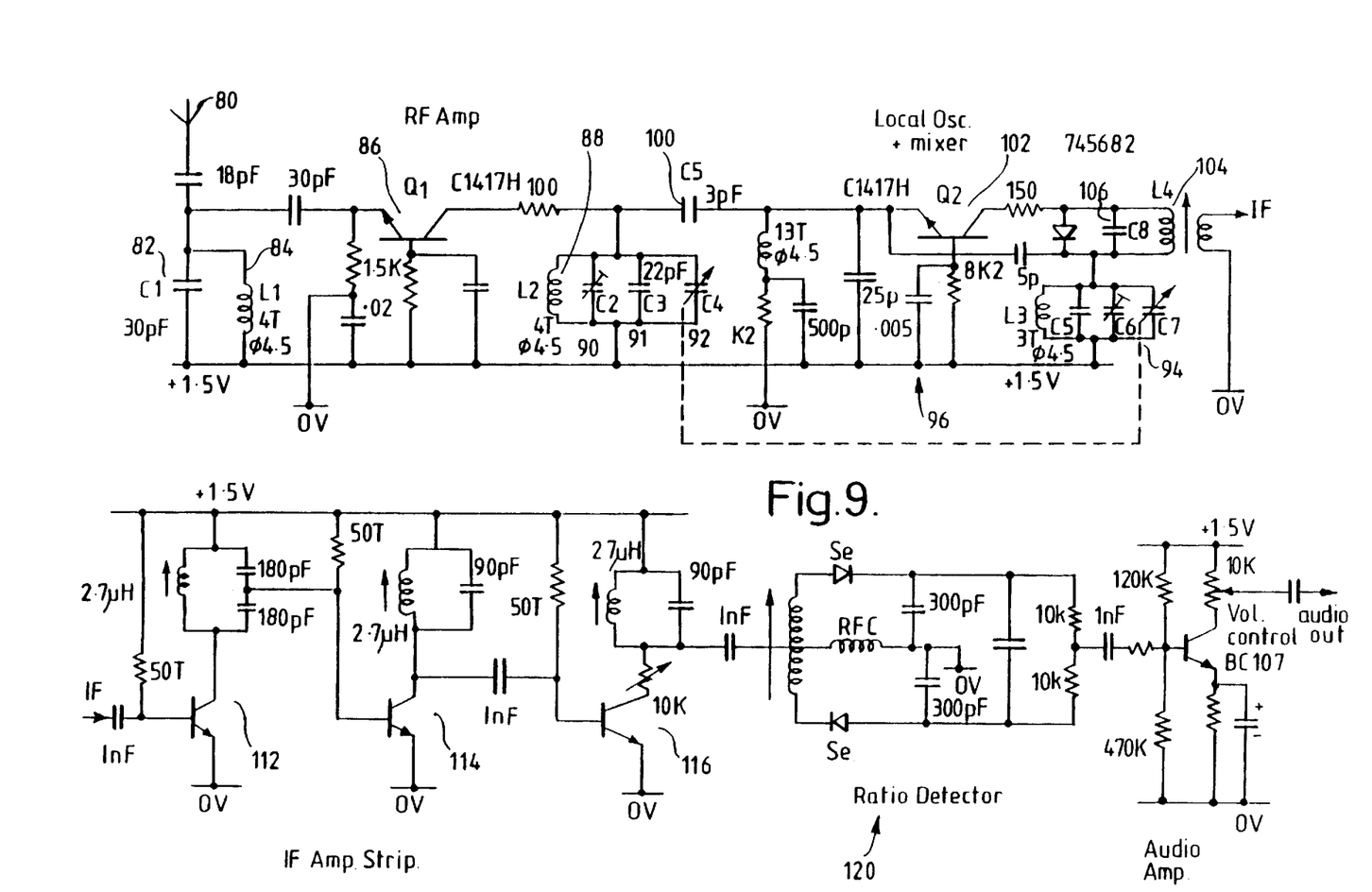
FIG. 9 is a circuit diagram of an FM receiver having low power requirements.

FIG. 9 is a circuit diagram of a radio receiver for use in receiving FM signals on VHF band 2 (88 to 108 MHz). An AM receiver employs the same basic principals for reducing power consumption, although would have a different aerial configuration (i.e. ferrite rod aerial) and a different intermediate frequency of 465 kHz instead of 10.7 MHz. The IF stages would not be gain limited and the detector would be an amplitude detector rather than a ratio or quadrature detector as used in the FM receiver.

The RF signal is captured by antenna 80 and applied to a tuned circuit formed by capacitor 82 and inductor 84. The signal is then amplified by transistor 86 operating in a common base configuration and using inductor 88 and capacitors 90 to 92 as its load. The resonant circuit formed by inductor 88 and capacitors 90 to 92 is tunable and is ganged with a tuned circuit 94 which controls the frequency of a local oscillator indicated generally as 96. Capacitor 100 passes the signal from a transistor 86 to the local oscillator 96 which also acts as a mixer stage. The combined local oscillator and mixer is built around transistor 102 operating in the common base configuration. The output of the combined mixer and local oscillator is obtained from a secondary winding on a tuned circuit formed by conductor 104 and capacitor 106. The local oscillator is arranged to be offset from the frequency of the tuned circuit formed by L2 and capacitors 90 to 92 by a predetermined frequency equal to the intermediate frequency. The output of the local oscillator/mixer 102 is then amplified in an intermediate frequency amplifier strip 110 comprising three gain stages 112, 114 and 116. Each stage has a transistor operating in a common-emitter mode and employs a tuned collector load. Only a very simple biasing arrangement has been shown in FIG. 9, although the person skilled in the art would understand that other biasing arrangements giving better thermal stability and protection against drift could also be used. The output of the IF amplifier strip 110 is supplied to a detector 120 of known design. In this case, the detector is a ratio detector. To reduce the signal amplitude which the final IF amplifier is required to produce, a quadrature detector could be advantageously employed. The output of the detector is amplified by a conventional class A amplifier stage 122 before being supplied to the class D amplifier.

Further savings in power consumption may be achieved by implementing a squelch function within the radio such that the output power amplifier stage can be closed down during periods of silence. Additionally, it is also possible to operate the receiver on a periodic basis, for example, 45000 times per second to obtain full audio quality or less frequently if a restricted bandwidth is acceptable. This is because it is quite feasible to power up the amplifiers and local oscillator, lock on to the radio signal, detect the instantaneous value of signal, pass it to the amplifier stage and de-power the receiver in a short period compared to the cycle time of the highest frequency component in the audio output.

The complete radio incorporating a piezoelectric speaker requires approximately 3 mW of power when providing speech and a comfortable listening level. This can be provided by a relatively low cost solar panel when illuminated by weak sunlight. The solar panel voltage varies considerably as lighting levels change. The simplest manner of dealing with this voltage variation is to use a zener diode or active transistor based clamping circuit to limit the voltage swings. A second solar panel could be used to obtain the 1.5 volt auxiliary supply for the radio receiver. Alternatively, the output of the solar panel could be applied to a switch mode converter which would enable the solar panel to always operate at its maximum power point. Furthermore, since a conventional switch mode converter employs pulse width modulation, as does the class D audio amplifier, there is commonality between the circuits of these devices, and consequently components can be shared. Alternatively, the output of the solar panel could be fed directly to a secondary battery to clamp the voltage by the solar cell and to store energy for use when sunlight is not available.

It is apparent that the radio can be powered by a plurality of sources, such as solar cells, primary cells, secondary cells or mechanical sources driving a generator. An energy management circuit can be provided within the radio to select the sources in order of preference, or on the basis of highest voltage level. Thus, a domestic radio may be equipped with a solar panel, which is the preferred source of power, but when there is insufficient power available from the solar panel, it would draw all or some of the required power from a secondary storage battery, previously charged by the solar panel, or as a last resort it would draw power from a set of dry cells (replaceable primary battery).

Test results in respect of the circuits shown in the accompanying figures demonstrate that the class D amplifier when operating with a piezoelectric speaker has a quiescent current of 0.4 mA when working with a 3 volt supply. The current drawn by the radio receiver is 1.1 mA. The quiescent current drawn from the 3 volt supply when the radio receiver was powered at 1.5 volts using the auxiliary supply converter, was 1.0 mA. Using a permanent magnet loudspeaker and discrete MOSFETs in the output stage of the amplifier, the quiescent current was 1.7 mA at 3 volts. Thus, the radio has a much lower current consumption than conventional radios.

The receiver circuit could also include automatic gain control and automatic frequency control. These functions would add to the overall power consumption of the radio, but not significantly. The audio amplifier may be modified to include negative feedback in order to increase its linearity. In a further modification, the radio may be powered from a 1.5 v battery with a DC-to-DC converter to generate a 3 v supply (or more) for use in the audio amplifier.

It is thus possible to provide a low power radio receiver.

What is claimed is:

1. An electrical device comprising a radio receiver circuit, a class D amplifier, and an audio output element, wherein the radio receiver circuit operates at a lower supply voltage than the amplifier, and the supply voltage for the radio receiver circuit is generated by a generator adapted to be operated in a switched manner.

2. A device as claimed in claim 1, characterized in that the class D amplifier comprises the generator.

3. A device as claimed in claim 1, characterized in that the class D amplifier is configured to have a half bridge output stage.

4. A device as claimed in claim 1, characterized in that the class D amplifier is configured to have a "R" bridge output stage.

5. A device as claimed in claim 1, characterized in that the audio output element is a loudspeaker.

6. A device as claimed in claim 5, characterized in that the loudspeaker is a moving coil loudspeaker.

7. A device as claimed in claim 5, characterized in that the loudspeaker is a piezoelectric transducer.

8. A device as claimed in claim 1, characterized in that the class D amplifier is housed in a shielded enclosure, wherein leads into and out of the enclosure are filtered to reduce electromagnetic interference.

9. A device as claimed in claim 8, characterized in that a clock generator and comparator for producing a pulse width modulated drive to the class D amplifier are also contained within the enclosure.

10. A device as claimed in claim 1, characterized in that a clock frequency for producing a pulse width modulated drive for the class D amplifier is in the range of 25 kHz to 120 kHz.

11. A device as claimed in claim 10, characterized in that the clock frequency is substantially 90 kHz when the output element is a piezoelectric transducer.

12. A device as claimed in claim 9, characterized in that the clock generator for use in the pulse-width modulated drive is used to drive a flip-flop configured to produce a square wave output at half the clock frequency.

13. A device as claimed in claim 12, characterized in that the output signal of the flip-flop is low pass filtered to derive a direct current supply of substantially 1.5 volts when the flip-flop is driven from a 3 volt supply.

14. A device as claimed in claim 13, characterized in that the derived direct current supply is used to power the radio receiver circuit.

15. A device as claimed in claim 1, characterized in that a comparator is used to compare the voltage supplied to the signal processing circuit with a reference voltage.

16. A device as claimed in claim 15, characterized in that the comparator is arranged to cause a charge on a storage capacitor to be topped up via a semiconductor element used in a switching mode when the voltage falls below a preset threshold.

17. A device as claimed in claim 1, characterized in that the receiver is a superheterodyne design.

18. A device as claimed in claim 1, characterized in that a plurality of resonant circuits in an intermediate frequency amplifier section of the superheterodyne receiver are formed from inductor capacitor combinations.

19. A device as claimed in claim 1, characterized in that the radio receiver circuit is implemented, at least in part, within an integrated circuit.

20. A device as claimed in claim 1, characterized in that the radio receiver is adapted to provide at least one of AM reception in the 500 kHz to 1600 kHz range, FM reception in the 88 MHz to 108 MHz range, and shortwave reception.

21. A device as claimed in claim 20, characterized in that an FM receiver circuit is adapted to use a 10.7 MHz intermediate frequency and quadrature detector for signal discrimination.

22. A device as claimed in claim 20, characterized in that an AM receiver section uses a substantially 465 kHz intermediate frequency.

23. A device as claimed in claim 1, characterized by further comprising a solar panel power supply.

24. A device as claimed in claim 23, characterized by further comprising a switched mode power converter for receiving the output of the solar panel and supplying power to the device.

25. A device as claimed in claim 23, characterized by further comprising a secondary battery to store power received from the solar cell.

26. A device as claimed in claim 1, further comprising at least one power source selected from the group consisting of a primary cell, a secondary cell, and a mechanical storage device, wherein the at least one power supply drives the generator.

27. A device as claimed in claim 26, wherein the at least one power source comprises the primary cell, the secondary cell, and the mechanical storage device, wherein the device further comprises means for sequentially selecting which of the power sources drives the generator in accordance with a predetermined order.

* * * * *